United States Patent
Stanton et al.

(10) Patent No.: US 7,065,209 B2
(45) Date of Patent: Jun. 20, 2006

(54) CONCEALED HOUSING LATCH ASSEMBLY FOR PORTABLE ELECTRONIC DEVICE

(75) Inventors: Stephen M. Stanton, Chandler, AZ (US); James L. Isbell, Phoenix, AZ (US); Matthew R. Michieli, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 73 days.

(21) Appl. No.: 10/696,884

(22) Filed: Oct. 30, 2003

(65) Prior Publication Data
US 2005/0092632 A1    May 5, 2005

(51) Int. Cl.
*H04M 1/03* (2006.01)
*B65D 45/04* (2006.01)
*B65D 45/22* (2006.01)

(52) U.S. Cl. .............. 379/433.01; 220/324; 455/575.1; 455/90.3

(58) Field of Classification Search ........... 379/433.01, 379/428.01, 435, 436; 455/575.1, 90.3; 220/324
See application file for complete search history.

(56) References Cited

U.S. PATENT DOCUMENTS 5,657,893 A * 8/1997 Hitchings ................... 220/324
5,944,210 A   8/1999 Yetter

FOREIGN PATENT DOCUMENTS

JP          8-9448      * 1/1996 ............ 379/433.01

* cited by examiner

*Primary Examiner*—Harry S. Hong
(74) *Attorney, Agent, or Firm*—Scott M. Garrett

(57) ABSTRACT

A first housing member (102) has a catch member (110) that engages a catch feature (302) on an inside surface of a second housing member (104) when the housing members are assembled together. A release window (117) is formed in the side of the second housing member to facilitate unlatching of the catch member from the catch feature. Alternatively, a latch release member (114) may be disposed in the release window so as to allow unlatching without the use of a tool. Additionally, the complaint covering may be formed so as to provide a water seal between the housing members, via sealing ridge (802) and a sealing groove (902).

21 Claims, 4 Drawing Sheets

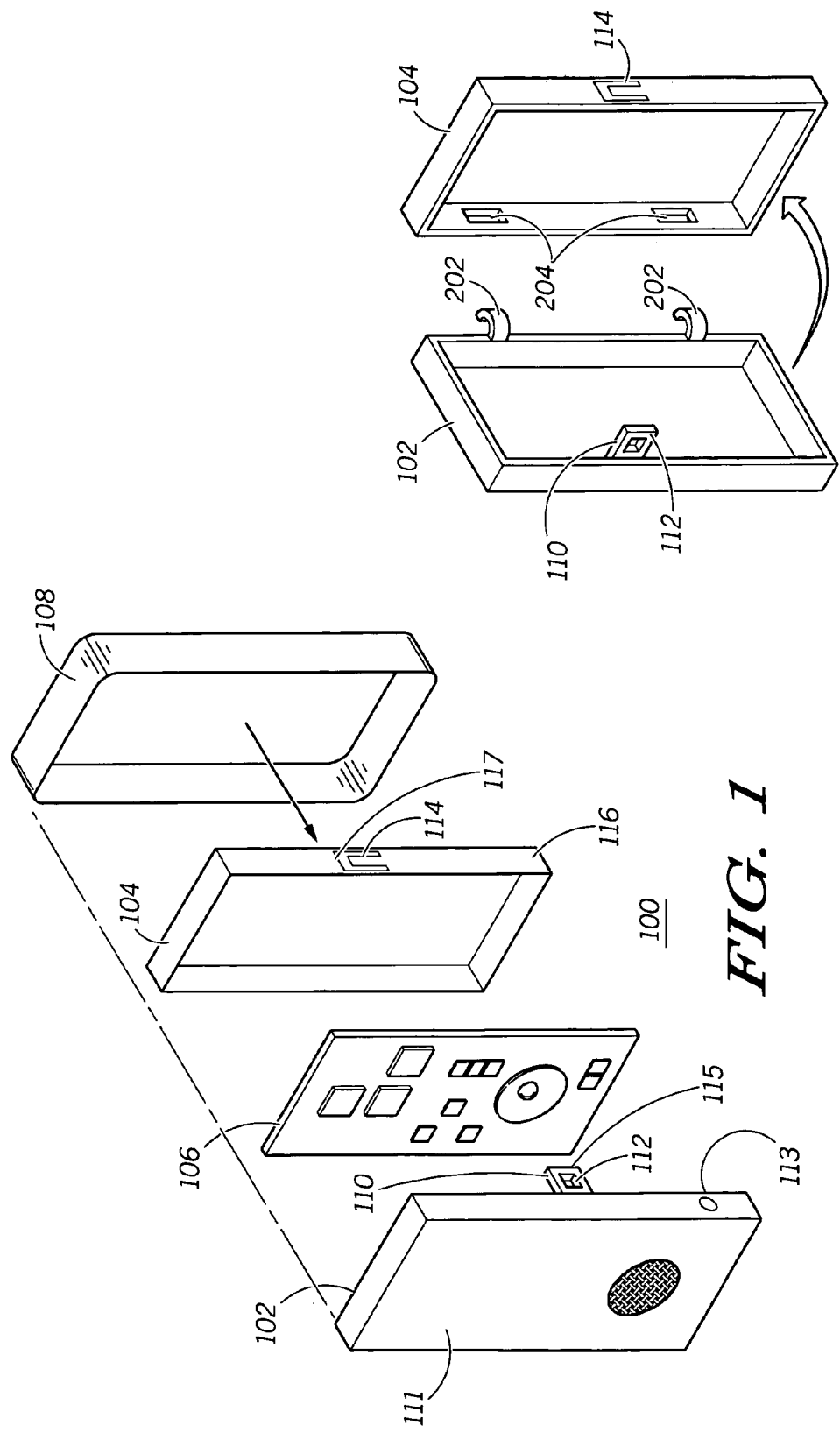

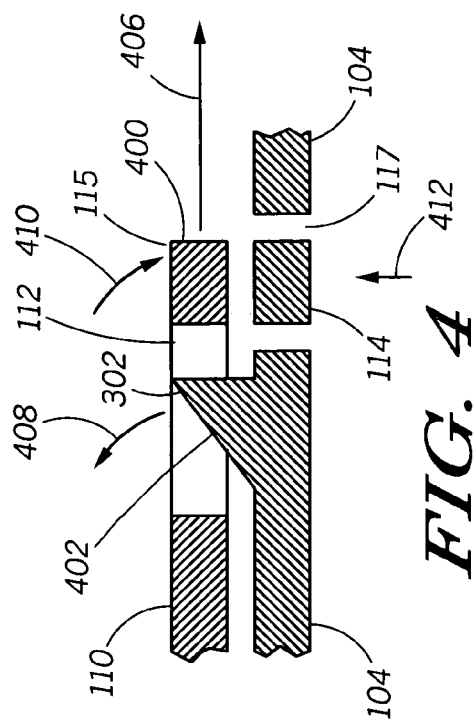
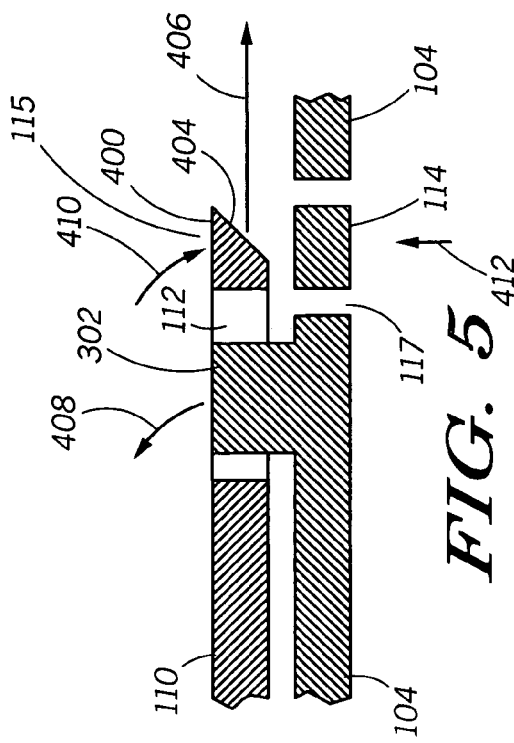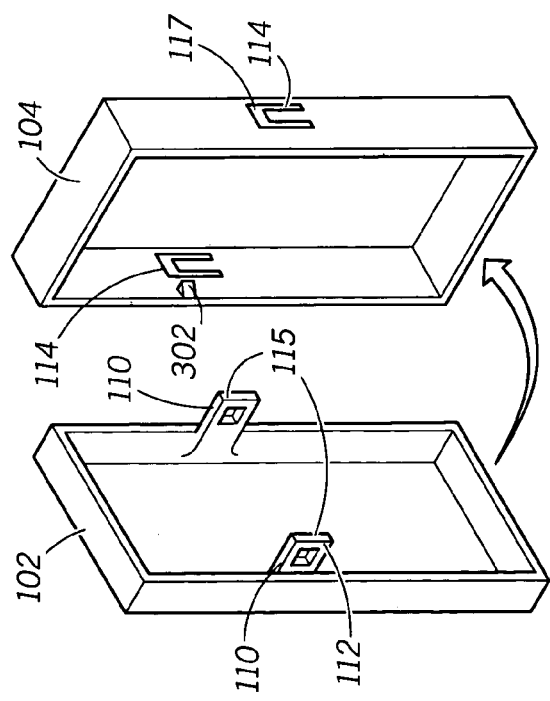

CONCEALED HOUSING LATCH ASSEMBLY FOR PORTABLE ELECTRONIC DEVICE

TECHNICAL FIELD

This invention relates in general to housings for portable electronic devices, and more particularly to latch assemblies used to semi-permanently close such housings.

BACKGROUND

Portable electronic devices are used for a wide variety of applications from personal digital assistants to cellular telephones and many other functions. Typically such devices house electronics and other components in a plastic housing which is made at least two housing portions. The housing portions can be joined together by a variety of means such as with fasteners like screws, integrally formed snap features, adhesives, and so on. Sometimes housings are designed to be opened by a user, such as to change a battery, for example, and some devices are sealed. Yet other devices are meant to be opened only by service technicians to make repairs and replacements to the device.

One of the simplest means for making a housing that can be opened and reassembled by a user or for service is with the use of a fastener such as a screw. However, in high volume manufacturing, the use of fasteners such as screws is sought to be avoided. In general there is a preference for the use of integrally formed cantilevered snaps or latches. These type of features are used for a variety of removable housing members, such as battery covers, for example. Latch or snap features can also be used to more permanently join major housing members together by disposing the features inside the housing. However, when the latch or snap features are located inside, it is not possible to take the housing apart to service the device without damaging the housing. The latch or snap features could be designed to be accessible from the outside, but doing so would allow users to tamper with the components inside the device, leaving manufacturers no way of knowing if a failure is caused by tampering or by a defect that may be covered by a warranty. Furthermore, tampering with devices that transmit radio frequency signals may cause the device to exceed permitted radiation specification, making the device an illegal radiator. Therefore there is a need by which housing members may be semi-permanently joined together that facilitates easy disassembly, but that resists tampering.

BRIEF DESCRIPTION OF THE DRAWINGS

The features of the present invention, which are believed to be novel, are set forth with particularly in the appended claims. The invention, together with further objects and advantages thereof, may best be understood by reference to the following description, taken in conjunction with the accompanying drawings, in the several figures of which like reference numerals identify like elements, and in which:

FIG. 1 is an exploded isometric view of a portable electronic device, in accordance with one embodiment the invention;

FIG. 2 is an exploded perspective view of housing portions for a portable electronic device, in accordance with one embodiment of the invention;

FIG. 3 is an exploded perspective view of housing portions for a portable electronic device, in accordance with one embodiment of the invention;

FIG. 4 is a cross sectional view of a latch assembly, in accordance with one embodiment of the invention;

FIG. 5 is a cross sectional view of a latch assembly, in accordance with one embodiment of the invention;

DETAILED DESCRIPTION OF THE PREFERRED EMBODIMENT

Figure 7:
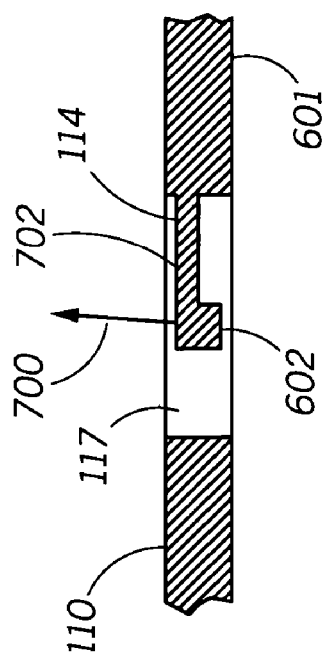
FIG. 7 is a cross sectional view of a latch release member, in accordance with one embodiment of the invention.

While the specification concludes with claims defining the features of the invention that are regarded as novel, it is believed that the invention will be better understood from a consideration of the following description in conjunction with the drawing figures, in which like reference numerals are carried forward.

The invention provides a means for semi-permanently joining major housing members of a portable electronic device in a way that makes disassembly easy for servicing the device, without destruction of the housing members, but that resists tampering. The invention provides internally disposed latch features that can be released by an external means that is concealed. By concealing the latch release features, consumer users will not be aware of their presence, yet service providers will be able to easily service the device. The latch is concealed by a compliant covering through which the latch release may be actuated. Furthermore, the compliant covering provides an integral water seal between the housing members to resist fluid intrusion into the device, in one embodiment of the invention.

Referring now to FIG. 1, there is shown an exploded isometric view 100 of a portable electronic device, in accordance with one embodiment the invention. The device comprises a first housing member 102, and a second housing member 104 for housing electrical and electronic components 106 between the housing members. The housing members 102, 104 may be, for example the rear and front housings, respectively, of a mobile communication device. A compliant covering 108 covers the second housing member 104. The compliant covering is preferably a rubber material, and provides a measure of vibration and shock protection to "ruggedize" the device.

A catch member 110 is disposed on the first housing member 102, and extends away from a rear surface 111 of the first housing member. The catch member extends beyond an edge 113 of the first housing member so that it can engage with corresponding features in the second housing member 104. The catch member is cantilevered, and deflectable, and has a catch opening 112 formed therethrough at a point between the edge 113 and a distal portion 115 of the catch member. At least one catch member is needed to latch the first and second housing members together, but in alternative embodiments more than one catch member may be used.

A release window 117 is formed at an opening in the side 116 of the second housing member 104. Once the first and second housing members are latched together, the distal portion 115 of the catch member 110 will be aligned with the release window 117. In one embodiment of the invention a latch release member 114 is disposed in the release window.

The latch release member is a cantilevered beam that bear against the distal portion of the catch member when actuated, so as to deflect the catch member and facilitate unlatching the housing members from each other. The release window, and latch release member, if present, are concealed by the compliant covering 108. In the preferred embodiment, the compliant covering is over-molded onto the second housing member when the second housing member is fabricated. It is contemplated that the compliant covering may cover only a portion of the second housing, or the entire outer surfaces of the second housing member.

Referring now to FIG. 2, there is shown an exploded perspective view 200 of housing portions for a portable electronic device, in accordance with one embodiment of the invention. Here one embodiment of a latch assembly is shown where only one catch member 110 is used. To hold the first and second housing members together while using only one catch member, at least one hook member 202 is disposed on one housing member to engage and hook a hook retaining window 204 in the other housing member. Once the hook or hooks are engaged, the housing members are rotated about an axis defined by the hook engagement, and the catch member latches onto a catch feature (shown in subsequent drawings) disposed in the second housing.

Alternatively, as shown in FIG. 3, which shows an exploded perspective view 300 of housing portions for a portable electronic device, in accordance with one embodiment of the invention, more than one catch member 110 may be used. The catch members are disposed on opposing sides of the first housing member. Each catch member 110 engages a catch features 302 disposed in the second housing member. The catch features are located in correspondence with the catch openings 112 on the catch members 110. As the housing members are moved towards each other, the cantilevered catch members are deflected by the distal portions of the catch members moving past the catch features until the catch openings allow the catch members to capture the catch features in the catch openings, thereby latching the housing members together.

Referring now to FIGS. 4–5, which show a cross sectional view of a latch assembly, in accordance with different embodiments of the invention. Along the bottom of the drawing is the side of the second housing member 104, without the compliant covering. As shown the catch member is engaged and the housing members are latched together. The catch feature 302 disposed on the second housing member 104 is situated in the catch opening 112 of the catch member 110. To latch the housing members together, the catch member is moved in the direction of arrow 406. As a leading edge 400 of the distal portion 115 of the catch member 110 encounters the catch feature, the catch member is deflected in the direction of arrow 408. Upon the distal portion moving past the catch feature 302, the catch member snap back in the direction of arrow 410 due to the cantilevered loading of the catch member. In FIG. 4, the deflection is accomplished by a ramp surface 402 on the catch feature. Alternatively, the leading edge 400 of the catch member may have a ramped surface 404 to deflect the catch member as if moves past the catch feature. Once the catch feature is captured I the catch opening, movement in the opposite direction of arrow 406 is prohibited by interference between the catch feature and the distal portion of the catch member. To release the catch member once it is latched in place, I the preferred embodiment, a latch release member 114 is actuated in the direction of arrow 412 to engage the distal portion of the catch member, and deflect it so that it clears the catch feature, allowing movement in the opposite direction of arrow 406. The latch release resides in a release window 117. Both the release window and latch release member, if present, will be concealed by the compliant covering (not shown). If the latch release member is not used, then a tool may be used to pierce the compliant covering an engage the distal portion of the catch member. The tool should have a small diameter so that the complaint covering will substantially close when it is withdrawn, leaving little to no indication that the tool had been used.

Figure 6:
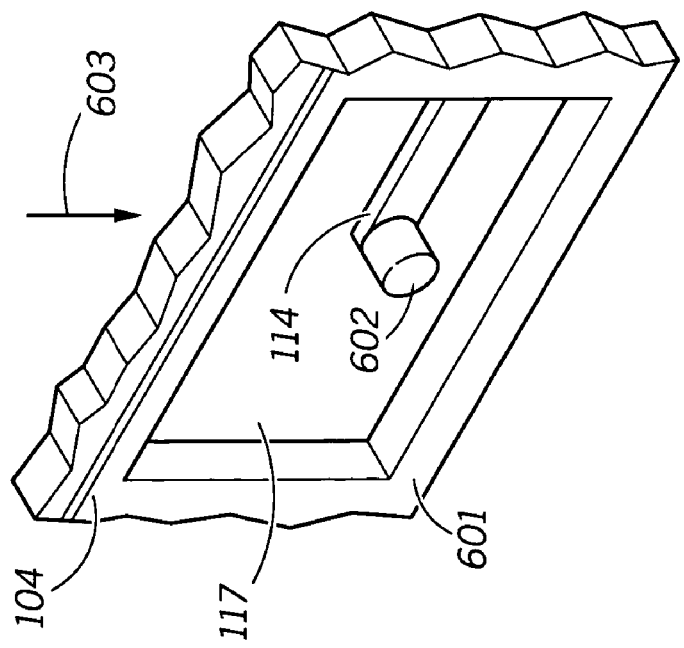
FIG. 6 is a perspective view of a latch release member, in accordance with one embodiment of the invention.

Referring now to FIGS. 6 and 7, there is shown a perspective view 600 of a latch release member, in accordance with one embodiment of the invention, and a cross sectional view of a latch release member, in accordance with one embodiment of the invention, respectively. The latch release member 114 is a cantilevered member that is used to deflect the catch member (as shown in previous drawings) so that the housing members may be unlatched from each other. In FIG. 6 the particular view shown is from an outside surface 601 of the second housing member. The latch release member resides in a release window 117 which is an opening formed in the side of the second housing at a point where the distal portion of the catch member will reside when the housing members are latched together. It should be noted that the compliant covering is not shown in these drawings and when present would cover the outer surface 601 and the release window 117. The latch release member has, in the preferred embodiment, an actuating head 602 that may be actuated by force in the direction of arrow 700, causing the inside surface 702 of the latch release member to bear against the distal portion of the catch member, causing the catch member to deflect also in the direction of arrow 700. As mentioned hereinabove, the latch release member may not be used, and instead a tool may be used to penetrate the compliant cover and deflect the catch member to facilitate unlatching of the housing members from each other.

Figure 8:
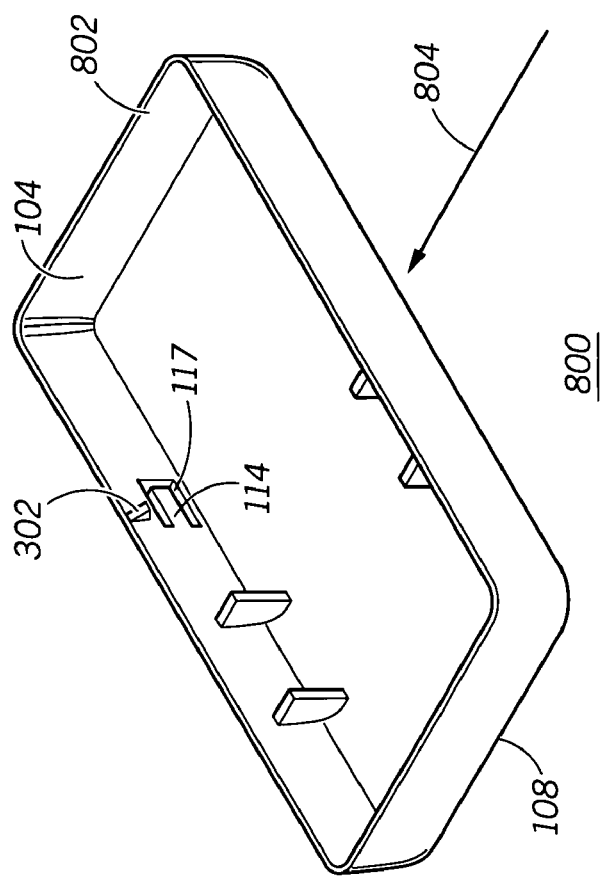
FIG. 8 is an isometric view of a housing portion for a portable electronic device, in accordance with one embodiment of the invention.

Referring now to FIG. 8, there is shown an isometric view 800 of a housing portion for a portable electronic device, in accordance with one embodiment of the invention. In particular this is the second housing member 104, or alternatively a front housing for a device such as a mobile communication device. Here the compliant covering 108 is shown over the exterior of the housing member. From the inside of the housing member the catch feature 302 can be seen along with the latch release member 114 in the release window 117. However, from the outside, on the opposite side of the housing member where arrow 804 points, the release window and latch release member are covered by the compliant covering, and are thus concealed. To unlatch the housing members, force would be applied at the point where arrow 804 points in the direction of arrow 804. In an alternative embodiment of the invention, the compliant covering provides a secondary purpose of providing a water seal between the housing members, and the latching assembly is used to maintain the integrity of the seal. In that embodiment, the compliant covering forms a sealing rim 802 along the edge of the housing. The ridge mates with a corresponding groove in the first housing, as shown in FIG. 9.

Figure 9:
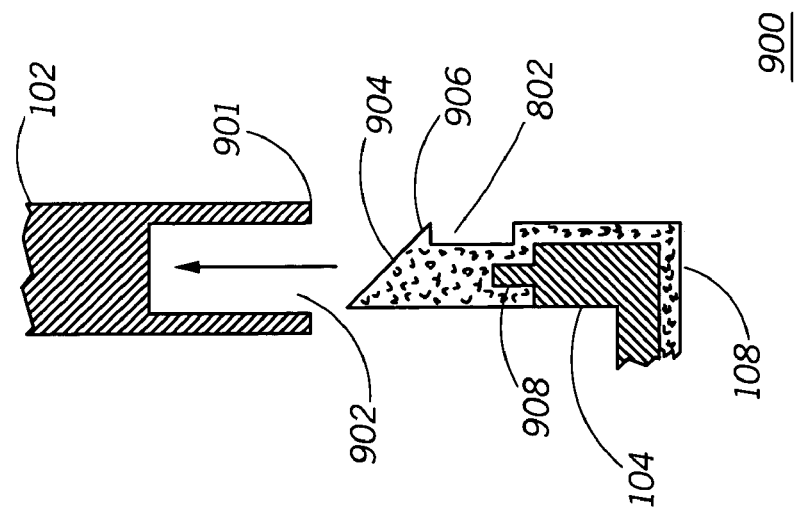
FIG. 9 is a cross sectional view of water seal which is secured by a latch assembly, in accordance with one embodiment of the invention.

Referring now to FIG. 9, there is shown a cross sectional view 900 of water seal which is secured by a latch assembly, in accordance with one embodiment of the invention. A sealing groove 902 is formed around the mating edge of the first housing member 102. The mating edge 901 of the first housing corresponds with the edge of the second housing. The complaint covering 108 is disposed on the second housing member 104, and forms a sealing ridge 802. The sealing ridge is formed over a tongue 908 formed along the edge of the second housing member. The tip 904 of the sealing ridge comprises a compressible ridge 906. The width of the sealing ridge at the compressible ridge is wider than the width of the sealing groove, so when the sealing ridge in moved into the sealing groove, the compressible ridge is compressed, forming a seal. In the preferred embodiment, the sealing ridge is formed when the compliant cover is over-molded onto the second housing member.

Thus, the invention provides a concealed housing latch assembly for a portable electronic device for latching a first housing member to a second housing member of the portable electronic device. The latch assembly includes at least one catch member disposed on the first housing member which extends away from the rear surface of the first housing member, and furthermore extends beyond an edge of the first housing member. The catch member is cantilevered and deflectable, and has a catch opening formed therethrough. At least one catch feature is formed on an inside surface of the second housing member at a position corresponding with the opening of the catch member captures the catch member when the housing members are latched together. In the preferred embodiment at least one cantilevered latch release member is formed in the second housing member at a position corresponding to the distal portion of the catch members. The latch release members facilitate deflecting the catch member upon actuating the latch release member so that the housing members may be unlatched. A compliant covering is disposed over the second housing member which acts to absorb vibration and shock experienced by the device, and to conceal the housing latch assembly. In a preferred embodiment of the invention the compliant covering forms a water seal between the first and second housing members. The water seal is formed by a sealing groove disposed along the perimeter of a mating edge of the first housing member and a sealing rim having compressible ridge disposed on the second housing member. The sealing rim corresponds to the sealing groove and is wider than the sealing groove at the compressible ridge. When the compressible ridge is compressed upon insertion of the sealing rim into the sealing groove, a seal is formed. In a preferred embodiment, the compliant covering is disposed onto the second housing member by an over-molding process.

In an alternative embodiment, the first housing member comprises at least one hook member on an opposite side of the first housing member from the catch member. The second housing member comprises at least one hook retaining window corresponding to the hook member for retaining the hook member therein upon assembly of the first housing member to the second housing member. Alternatively two catch members may be used in the first housing member, along with corresponding catch features in the second housing member. To facilitate deflection of the catch member, either the catch feature may be ramped, or a leading edge of the distal portion of the catch member may be ramped.

It is contemplated that device may be a mobile communication device, and the invention comprises a housing member of the mobile communication device having the features described herein. In addition, it is contemplated that the features and latch members described herein may be designed so that they appear on the opposite housing member from that described here. One of ordinary skill would recognize such a design change as an equivalent of the particular embodiment described in detail herein.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A concealed housing latch assembly for portable electronic device for latching a first housing member to a second housing member of the portable electronic device, the housing latch comprising:

at least one catch member disposed on the first housing member extending away from a rear surface of the first housing member and extending beyond an edge of the first housing member, the at least one catch member being deflectable and having a catch opening formed therethrough and having a distal portion;

at least one catch feature formed on an inside surface of the second housing member at a position corresponding with the opening of the at least one catch member for capturing the at least one catch member;

at least one cantilevered latch release member formed in the second housing member at a position corresponding to the distal portion of the at least one catch member for deflecting the at least one catch member upon actuating the latch release member; and a compliant covering disposed over the second housing member, the compliant covering concealing the housing latch assembly;

wherein the at least one cantilevered latch release member may be deflected through the complaint covering to release the at least one catch member from the at least one catch feature.

2. A concealed housing latch assembly as defined in claim 1, wherein the compliant covering forms a water seal between the first and second housing members.

3. A concealed housing latch assembly as defined in claim 2, wherein:

the first housing member further comprises a sealing groove disposed along the perimeter a mating edge of the first housing member; and the compliant covering further comprises a sealing rim having compressible ridge, the sealing rim corresponding to the sealing groove and being wider than the sealing groove at the compressible ridge, and wherein the compressible ridge is compressed upon insertion of the sealing rim into the sealing groove.

4. A concealed housing latch assembly as defined in claim 1, wherein the compliant covering is disposed onto the second housing member by an over-molding process.

5. A concealed housing latch assembly as defined in claim 1, wherein:

the first housing member further comprises at least one hook member on an opposite side of the first housing member from the catch member; and the second housing member further comprises at least one hook retaining window corresponding to the at least one hook member for retaining the at least one hook member therein upon assembly of the first housing member to the second housing member.

6. A concealed housing latch assembly as defined in claim 1 wherein:

the at least one catch member comprises two catch members disposed on opposing sides of the first housing member;

the at least one catch feature comprises two catch features disposed on opposing sides of the second housing member in correspondence with the two catch members, respectively; and the at least one latch release member comprises two latch release members disposed in opposing sides of the second housing members in correspondence with the distal portions of the two catch members, respectively.

7. A concealed housing latch assembly as defined in claim 1, wherein die at least one catch feature is ramped to facilitate deflection of the at least one catch member.

8. A concealed housing latch assembly as defined in claim 1, wherein the at least one catch member is ramped at a distal edge to facilitate deflection of the at least one catch member as the at least one catch member moves past the at least one catch feature.

9. A latch assembly for a portable electronic device, comprising:
  a catch member disposed on a first housing member of the operable electronic device;
  a catch feature disposed on a second housing member of the portable electronic device for capturing the catch member;
  wherein the second housing member comprises a release window formed in correspondence with a distal portion of the catch member, and a compliant coveting that conceals the release window; and
  wherein the catch member may be released from the catch feature through the complaint covering at the release window.

10. A latch assembly as defined in claim 9, further comprising a cantilevered latch release member disposed in the release window for facilitating release of the catch member from the catch feature upon actuation of the latch release member, the compliant covering concealing the latch release member.

11. A latch assembly as defined in claim 9, wherein the compliant covering forms a water seal between the first and second housing members.

12. A latch assembly as defined in claim 11, wherein:
  the first housing member further comprises a sealing groove disposed along the perimeter a mating edge of the first housing member; and
  the compliant covering further comprises a sealing rim having compressible ridge, the sealing rim corresponding to the sealing groove and being wider than the sealing groove at the compressible ridge, and wherein the compressible ridge is compressed upon insertion of the sealing rim into the sealing groove.

13. A latch assembly as defined in claim 9, wherein the compliant covering is disposed onto the second housing member by an over-molding process.

14. A latch assembly as defined in claim 9, wherein:
  the first housing member further comprises at least one hook member on an opposite side of the first housing member from the catch member; and
  the second housing member further comprises at least one hook retaining window corresponding to the at least one hook member for retaining the at least one hook member therein upon assembly of the first housing member to the second housing member.

15. A latch assembly as defined in claim 9, wherein:
  the catch member is a first catch member, the latch assembly further comprises a second catch member disposed on an opposing side of the first housing member form the first catch member;
  the catch feature is a first catch feature, the latch assembly comprises a second catch feature disposed on an opposing sides of the second housing member in correspondence with the second catch member; and
  the release window is a first release window, the latch assembly comprises a second release window disposed on opposing sides of the second housing members from the first release window and in correspondence with the second latch member.

16. A latch assembly as defined in claim 9, wherein the catch feature is ramped to facilitate deflection of the catch member.

17. A latch assembly as defined in claim 9, wherein the catch member is ramped at a distal edge to facilitate deflection of the catch member as the catch member moves past catch feature.

18. A front housing for a mobile communication device, the front housing for mating with a rear housing having at least one catch member for latching the front and rear housings together, the front housing comprising:
  at least one catch feature disposed on an inside surface of the front housing, and positioned in correspondence with an opening of the at least one catch member for capturing the at least one catch member;
  at least one release window formed in a side surface of the front housing located in correspondence with a distal portion of the at least one catch member when the front and rear housings are latched together; and
  a compliant covering for concealing the at least one release window disposed on an outer surface of the front housing;
  wherein the at least one catch member may be released from the at least one catch feature through the complaint covering at the at least one release window.

19. A front housing for a mobile communication device as defined in claim 18, wherein the compliant covering forms a water seal between the front and rear housings.

20. A front housing for a mobile communication device as defined in claim 19, wherein the rear housing comprises a sealing groove disposed along a perimeter of a mating edge of the rear housing, the front housing further comprising a sealing rim having compressible ridge, the sealing rim corresponding to the sealing groove and being wider than the sealing groove at the compressible ridge, and wherein the compressible ridge is compressed upon insertion of the sealing rim into the sealing groove.

21. A front housing for a mobile communication device as defined in claim 18, wherein the at least one catch feature is ramped to facilitate deflection of the at least one catch member.

* * * * *